(12) United States Patent
Zhang

(10) Patent No.: US 8,841,207 B2
(45) Date of Patent: Sep. 23, 2014

(54) REUSABLE SUBSTRATES FOR ELECTRONIC DEVICE FABRICATION AND METHODS THEREOF

(75) Inventor: Baoguo Zhang, San Jose, CA (US)

(73) Assignee: Lux Material Co., Ltd., Jiangyin (CN)

(*) Notice: Subject to any disclaimer, the term of this patent is extended or adjusted under 35 U.S.C. 154(b) by 103 days.

(21) Appl. No.: 13/439,677

(22) Filed: Apr. 4, 2012

(65) Prior Publication Data
US 2013/0095640 A1    Apr. 18, 2013

Related U.S. Application Data

(60) Provisional application No. 61/516,755, filed on Apr. 8, 2011.

(51) Int. Cl.
*H01L 33/02* (2010.01)
*H01L 21/36* (2006.01)
*H01L 31/0236* (2006.01)
*H01L 21/683* (2006.01)

(52) U.S. Cl.
CPC .......... *H01L 31/02366* (2013.01); *H01L 21/36* (2013.01); *H01L 21/6835* (2013.01); *H01L 2221/68318* (2013.01)
USPC ............................................. 438/492; 117/97

(58) Field of Classification Search
CPC ................ H01L 21/02639; H01L 21/0243; H01L 21/7813; H01L 33/0079; H01L 21/2011
USPC .......... 257/E21.601, E21.103; 438/458, 459, 438/479, 977, 492; 148/33.2; 117/97
See application file for complete search history.

(56) References Cited

U.S. PATENT DOCUMENTS

| 6,163,557 | A | 12/2000 | Dunnrowicz et al. |
| 6,177,359 | B1 * | 1/2001 | Chen et al. .................... 438/751 |
| 6,261,929 | B1 | 7/2001 | Gehrke et al. |
| 6,323,108 | B1 * | 11/2001 | Kub et al. ..................... 438/458 |
| 6,429,095 | B1 | 8/2002 | Sakaguchi et al. |
| 7,842,547 | B2 | 11/2010 | Shelton et al. |
| 2002/0068201 | A1 | 6/2002 | Vaudo et al. |

(Continued)

FOREIGN PATENT DOCUMENTS

CN       102087484 A       6/2011

OTHER PUBLICATIONS

Patent Cooperation Treaty, International Search Report for related application PCT/US2012/032254, mailed Jul. 16, 2012.

(Continued)

*Primary Examiner* — George Fourson, III
(74) *Attorney, Agent, or Firm* — Jones Day

(57) ABSTRACT

Substrates for electronic device fabrication and methods thereof. A reusable substrate with at least a plurality of grooves for electronic device fabrication includes a substrate body made of one or more substrate materials and including a top planar surface, the top planar surface being divided into a plurality of planer regions by the plurality of grooves, the plurality of grooves including a plurality of bottom planar surfaces. Each of the plurality of grooves includes a bottom planar surface and two side surfaces, the bottom planar surface being selected from the plurality of bottom planar surfaces, the two side surfaces being in contact with the top surface and the bottom surface. The bottom planar surface is associated with a groove width from one of the two side surfaces to the other of the two side surfaces, the groove width ranging from 0.1 μm to 5 mm.

14 Claims, 6 Drawing Sheets

(56) References Cited

U.S. PATENT DOCUMENTS

| | | |
|---|---|---|
| 2003/0114017 A1 | 6/2003 | Wong et al. |
| 2008/0067622 A1 | 3/2008 | Bui et al. |
| 2009/0035534 A1 | 2/2009 | Su et al. |
| 2010/0109019 A1 | 5/2010 | Yonehara |
| 2010/0122773 A1* | 5/2010 | Noh ..................... 156/345.29 |
| 2010/0270651 A1 | 10/2010 | Li et al. |
| 2010/0317132 A1* | 12/2010 | Rogers et al. ............... 438/27 |
| 2011/0136324 A1* | 6/2011 | Ashdown et al. ........... 438/464 |
| 2011/0143467 A1* | 6/2011 | Xiong et al. ................ 438/29 |
| 2013/0037857 A1* | 2/2013 | Von Kanel et al. ......... 257/190 |
| 2013/0095640 A1* | 4/2013 | Zhang ....................... 438/478 |

OTHER PUBLICATIONS

Patent Cooperation Treaty, Written Opinion of the International Searching Authority for related application PCT/US2012/032254, mailed Jul. 16, 2012.

Hsieh, Chi-Hsun, "Investigation of Properties of GaN Light-Emitting Diodes Grown on Patterned Sapphire Substrates," Master's Thesis, submitted Jul. 16, 2007, National Central University, Taoyuan, Taiwan (English language abstract found on the $7^{th}$ and $8^{th}$ pages of the document).

Mendes et al., "Lasers in the Manufacturing of LEDs," *Photonics Spectra*, Jun. 2010.

\* cited by examiner

US 8,841,207 B2

REUSABLE SUBSTRATES FOR ELECTRONIC DEVICE FABRICATION AND METHODS THEREOF

1. CROSS-REFERENCES TO RELATED APPLICATIONS

This application claims priority to U.S. Provisional Application No. 61/516,755, filed on Apr. 8, 2011, commonly assigned, incorporated by reference herein for all purposes.

2. BACKGROUND OF THE INVENTION

The present invention is directed to material processing and device fabrication. More particularly, the invention provides reusable substrates for electronic device fabrication and methods for preparing such substrates. Merely by way of example, the invention has been applied to light emitting diodes. But it would be recognized that the invention has a much broader range of applicability.

Light emitting diodes (LEDs) have been widely used in various electronics applications. To fabricate light emitting diodes, substrates are often important. In order to select a proper substrate, various factors, such as characteristics of fabrication equipments and/or desired LED devices, should be taken into account.

Conventionally, sapphire (e.g., $Al_2O_3$), silicon and silicon carbide have been selected to make substrates for LED fabrication. For example, a mono-crystalline sapphire substrate has been used to fabricate blue light/white light/ultra-violet light LEDs, laser diodes, high-frequency microwave devices and high-voltage power devices. In particular, gallium nitride (e.g., GaN) thin films (e.g., with a band gap of about 3.4 eV) are often epitaxially formed on the mono-crystalline sapphire substrate for device fabrication.

Sapphire materials often exhibit high melting temperatures, high hardness, and strong resistance to chemicals. Manufacturing of such mono-crystalline sapphire materials can consume significant electric power. Moreover, it may take tens of days for crystal growth of mono-crystalline sapphire with only a low yield. Thus, mono-crystalline sapphire ingots often are expensive to produce. In addition, the process to manufacture sapphire wafers from sapphire ingots is usually complex. As such, it can be costly to make mono-crystalline sapphire substrates.

Furthermore, on a mono-crystalline sapphire substrate, one or more epitaxial layers (e.g., GaN) can be formed through various processes (e.g., metal organic chemical vapor deposition (MOCVD)) in order to form an epitaxial structure. Afterwards, devices can be fabricated on the epitaxial structure including the sapphire substrate. Then, the sapphire substrate with the fabricated devices often is cut into small pieces (e.g., less than 1 mm by 1 mm) before the devices are separated from the sapphire substrate by a laser lift-off process (LLO). The conventional LLO technique often cannot successfully separate devices from a sapphire substrate if the substrate has a large size (e.g., larger than 5 mm by 5 mm). In addition, after the LLO process, the small pieces of the sapphire substrate usually cannot be reused. Thus, the conventional device-fabrication process often incurs high cost and may cause significant substrate waste.

Hence it is highly desirable to improve the techniques of material processing and device fabrication.

3. BRIEF SUMMARY OF THE INVENTION

The present invention is directed to material processing and device fabrication. More particularly, the invention provides reusable substrates for electronic device fabrication and methods for preparing such substrates. Merely by way of example, the invention has been applied to light emitting diodes. But it would be recognized that the invention has a much broader range of applicability.

According to one embodiment, a reusable substrate with at least a plurality of grooves for electronic device fabrication includes a substrate body made of one or more substrate materials and including a top planar surface, the top planar surface being divided into a plurality of planer regions by the plurality of grooves, the plurality of grooves including a plurality of bottom planar surfaces. Each of the plurality of grooves includes a bottom planar surface and two side surfaces, the bottom planar surface being selected from the plurality of bottom planar surfaces, the two side surfaces being in contact with the top surface and the bottom surface. The bottom planar surface is associated with a groove width from one of the two side surfaces to the other of the two side surfaces, the groove width ranging from 0.1 μm to 5 mm. The two side surfaces are associated with a groove depth from the top planar surface to the bottom planar surface, the groove depth ranging from 1 nm to 500 μm. Each of the plurality of regions is surrounded by a first groove, a second groove, a third groove and a fourth groove, all of the first groove, the second groove, the third groove and the fourth groove being selected from the plurality of grooves. The first groove and the second groove are parallel to each other and separated by a first groove interval ranging from 0.1 mm to 50 mm. The third groove and the fourth groove are parallel to each other and separated by a second groove interval ranging from 0.1 mm to 50 mm. The first groove and the third groove are perpendicular to each other. The top planar surface is parallel to each of the plurality of bottom surfaces, the top planar surface being associated with a first surface area, the plurality of bottom surfaces together being associated with a second surface area. The second surface area is equal to or less than 10% of a sum of the first surface area and the second surface area.

According to another embodiment, a reusable substrate with at least a plurality of grooves for electronic device fabrication includes a substrate body made of sapphire and including a top planar surface, the top planar surface being divided into a plurality of planer regions by the plurality of grooves, the plurality of grooves including a plurality of bottom planar surfaces. Each of the plurality of grooves includes a bottom planar surface and two side surfaces, the bottom planar surface being selected from the plurality of bottom planar surfaces, the two side surfaces being in contact with the top surface and the bottom surface. The bottom planar surface is associated with a groove width from one of the two side surfaces to the other of the two side surfaces, the groove width ranging from 0.1 μm to 5 mm. The two side surfaces are associated with a groove depth from the top planar surface to the bottom planar surface, the groove depth ranging from 1 nm to 500 μm. Each of the plurality of regions is surrounded by a first groove, a second groove, a third groove and a fourth groove, all of the first groove, the second groove, the third groove and the fourth groove being selected from the plurality of grooves. The first groove and the second groove are parallel to each other and separated by a first groove interval ranging from 0.1 mm to 50 mm. The third groove and the fourth groove are parallel to each other and separated by a second groove interval ranging from 0.1 mm to 50 mm. The first groove and the third groove are perpendicular to each other. The top planar surface is parallel to each of the plurality of bottom surfaces, the top planar surface being associated with a first surface area, the plurality of bottom surfaces together being associated with a second surface area.

The second surface area is equal to or less than 10% of a sum of the first surface area and the second surface area.

According to yet another embodiment, a method for making a reusable substrate with at least a plurality of grooves for electronic device fabrication includes providing a substrate body made of one or more substrate materials and including a top surface, polishing the substrate body to planarize the top surface, and coating the substrate body by forming a photoresist layer on the planarized top surface. The method further includes patterning the photoresist layer, using the patterned photoresist layer to form the plurality of grooves in the substrate body, and dividing the top planar surface by the plurality of grooves into a plurality of planar regions, the plurality of planar regions including a plurality of planar bottom surfaces parallel to the top planar surface, each of the plurality of grooves being associated with a groove width ranging from 0.1 µm to 5 mm and a groove depth ranging from 1 nm to 500 µm, each of the planar regions being associated with a dimension ranging from 0.1 mm to 50 mm. The top planar surface is associated with a first surface area. The plurality of bottom surfaces together is associated with a second surface area. The second surface area is equal to or less than 10% of a sum of the first surface area and the second surface area.

According to yet another embodiment, a method for using a reusable substrate made of at least a first material with at least a plurality of grooves for electronic device fabrication includes preparing the reusable substrate including a top planar surface, the top planar surface being divided by the plurality of grooves into a plurality of planar regions, the plurality of planar regions including a plurality of planar bottom surfaces parallel to the top planar surface, each of the plurality of grooves being associated with a groove width ranging from 0.1 µm to 5 mm and a groove depth ranging from 1 nm to 500 µm, each of the planar regions being associated with a dimension ranging from 0.1 mm to 50 mm. The method further includes forming at least a first epitaxial layer made of at least a second material on the plurality of planar regions, separating at least the first epitaxial layer from each of the plurality of planar regions, and after at least the first epitaxial layer is separated from each of the plurality of planar regions, forming at least a second epitaxial layer made of at least a third material on the plurality of planar regions. The plurality of planar regions together is associated with a first surface area. The plurality of bottom surfaces together is associated with a second surface area. The second surface area is equal to or less than 10% of a sum of the first surface area and the second surface area.

Many benefits are achieved by way of the present invention over conventional techniques. Some embodiments of the present invention provides a reusable substrate (e.g., sapphire) with grooves. For example, devices fabricated on the reusable substrate can be separated from the substrate. In another example, then, the substrate can be polished and cleaned for reuse as epi-ready grade for as many times as possible, as long as the device fabrication process permits. Certain embodiments of the present invention provides a reusable substrate (e.g., sapphire) for reducing fabrication costs significantly. For example, if the substrate is reused for 100 times, the cost would be lowered by a factor of 1/100. Some embodiments of the present invention provides a reusable substrate (e.g., sapphire) with a groove matrix to reduce stress in thin films (e.g., GaN) formed on the substrate due to lattice mismatch and increase the quality of the thin films. Certain embodiments of the present invention provides a reusable substrate (e.g., sapphire) which includes grooves to effectively dissipate heat generated during the LLO process, and to eliminate some wafer-processing steps such as backside thinning for device fabrication. Some embodiments of the present invention provides a reusable substrate (e.g., sapphire) and LED devices are fabricated on the substrate and then separated from the substrate (e.g., using LLO). Then, for example, reflective metals, such as aluminum and/or silver, are deposited on a backside of the devices to boost the brightness of the LED devices. In another example, heat-conducting materials, such as silicon and/or aluminum nitride, are deposited on the backside of the devices as heat sinks to improve heat dissipation of the devices.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

The present invention is directed to material processing and device fabrication. More particularly, the invention provides reusable substrates for electronic device fabrication and methods for preparing such substrates. Merely by way of example, the invention has been applied to light emitting diodes. But it would be recognized that the invention has a much broader range of applicability.

Figure 1A:
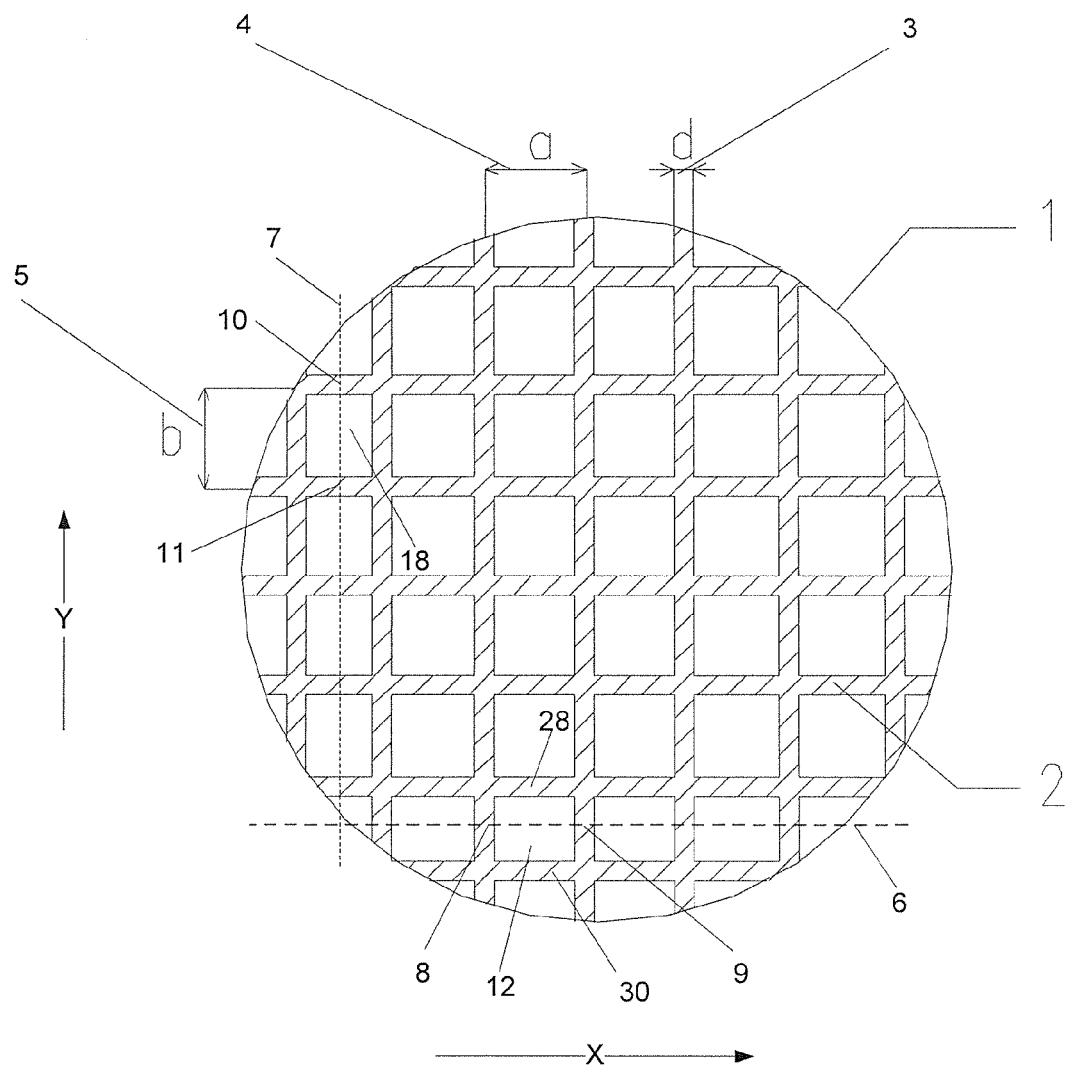
FIG. 1(A) is a simplified diagram showing a top view of a reusable substrate according to an embodiment of the present invention.

FIG. 1(A) is a simplified diagram showing a top view of a reusable substrate according to an embodiment of the present invention. This diagram is merely an example, which should not unduly limit the scope of the claims. One of ordinary skill in the art would recognize many variations, alternatives, and modifications. As shown by the top view in FIG. 1(A), the substrate 1 is made from mono-crystalline sapphire materials, e.g., a cut sapphire, a grinded sapphire, and/or a polished sapphire, according to certain embodiments. The substrate 1 can be made from other materials, such as mono-crystalline SiC, mono-crystalline GaN, mono-crystalline GaAs, mono-crystalline Si, mono-crystalline AlN, mono-crystalline ZnO, mono-crystalline MgO, in some embodiments.

According to one embodiment, the substrate 1 includes, in its top portion, patterned grooves 2, as shown in FIG. 1(A). For example, the substrate 1 has a thickness approximately in a range of 5 µm-10 mm. In another example, at least part of the grooves form a matrix on the surface of the substrate 1, as shown in FIG. 1(A). In yet another example, along one direction (e.g., along the X axis), a gap 4 between two grooves is approximately in a range of 0.1-50 mm. In yet another example, along another direction (e.g., along the Y axis), a gap 5 between two grooves is approximately in a range of 0.1-50 mm. In yet another example, the X axis and the Y axis are perpendicular to each other. In yet another example, the substrate includes a top surface (e.g., a top planar surface), and the grooves divide the top surface into a plurality of regions (e.g., planar regions 12 and 18). In yet another example, the region 12 is surrounded by four grooves 8, 9, 28 and 30. In yet another example, the grooves 8 and 9 are parallel to each other and are separated by a gap equal to the gap 4 in distance. In yet another example, the grooves 28 and 30 are parallel to each other and are separated by a gap equal to the gap 5 in distance. In yet another example, the groove 8 and the groove 28 are perpendicular to each other, and the groove 9 and the groove 30 are perpendicular to each other.

According to another embodiment, from a top view, the substrate 1 can be of any shape with a proper size. For example, as shown in FIG. 1(A), the substrate 1 has a circular shape, and has a diameter approximately in a range of 25-300 mm (e.g., 2", 3", 4", 5", 6" and 8"). In another example, the substrate 1 has a square shape, and has a side length approximately in a range of 25-300 mm. In yet another example, the substrate 1 has another shape, such as a rectangle shape, a diamond shape, or a triangle shape. In yet another example, from the top view, the grooves in total occupy a portion of the entire substrate 1 (e.g., no larger than 10% in area).

Figure 1B:
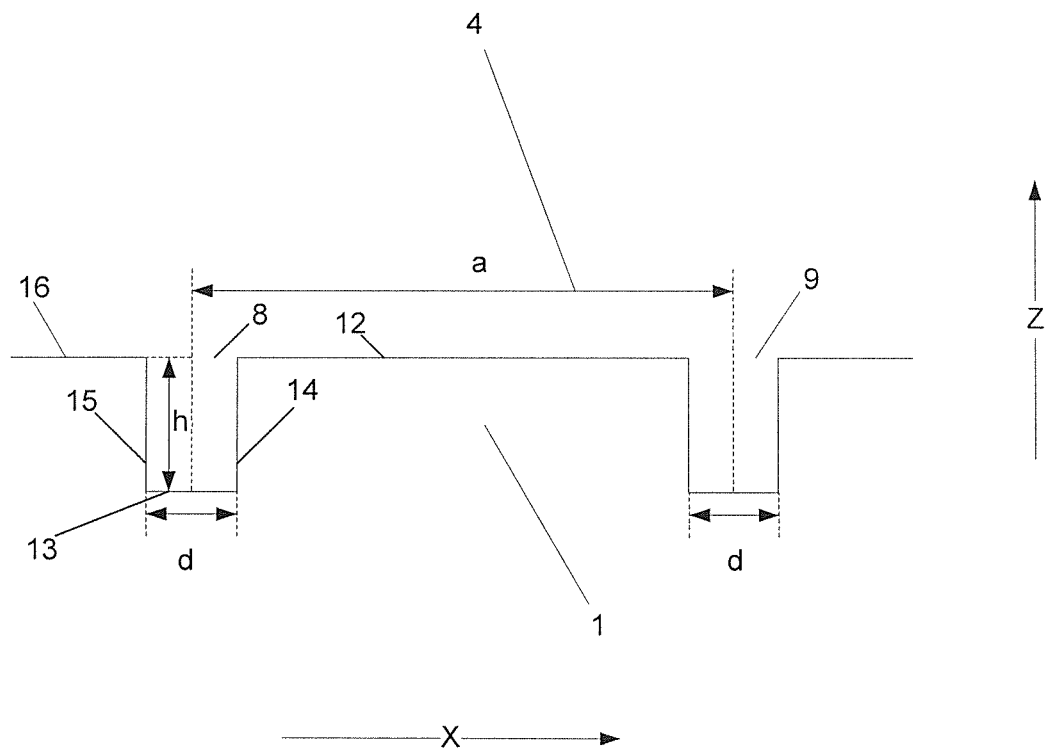
FIG. 1(B) is a simplified diagram showing a cross-section view of the reusable substrate along the X axis according to an embodiment of the present invention.

FIG. 1(B) is a simplified diagram showing a cross-section view of the reusable substrate 1 along the X axis according to an embodiment of the present invention. This diagram is merely an example, which should not unduly limit the scope of the claims. One of ordinary skill in the art would recognize many variations, alternatives, and modifications. For example, along a line 6 (e.g., along the X axis), a cross-section view of two grooves 8 and 9 are shown in FIG. 1(B).

In one embodiment, the groove 8 has a bottom surface 13 (e.g., a planar bottom surface) and two side surfaces 14 and 15. For example, the side surfaces 14 and 15 are in contact, directly or indirectly, with regions 12 and 16 of the top surface of the substrate 1 respectively. In another example, the side surfaces 14 and 15 are in contact, directly or indirectly, with the bottom surface 13. In yet another example, the depth (e.g., h) of the groove 8 is approximately in a range of 1 nm-500 μm. In yet another example, the width (e.g., d) of the groove 8 (e.g., between the side surfaces 14 and 15) is approximately in a range of 0.1 μm-5 mm. In yet another example, the Z axis is perpendicular to the X axis and the Y axis. In yet another example, the bottom surface 13 is parallel to the top surface of the substrate 1. In yet another example, the side surfaces 14 and 15 are not continuous. In yet another example, the side surfaces 14 and 15 are in contact with the bottom surface 13 through one or more other surfaces. In yet another example, the bottom surface 13 has overlaps with a bottom surface of the groove 28 and a bottom surface of the groove 30 in certain areas. In yet another example, the groove 9 has a similar structure as the groove 8.

Figure 1C:
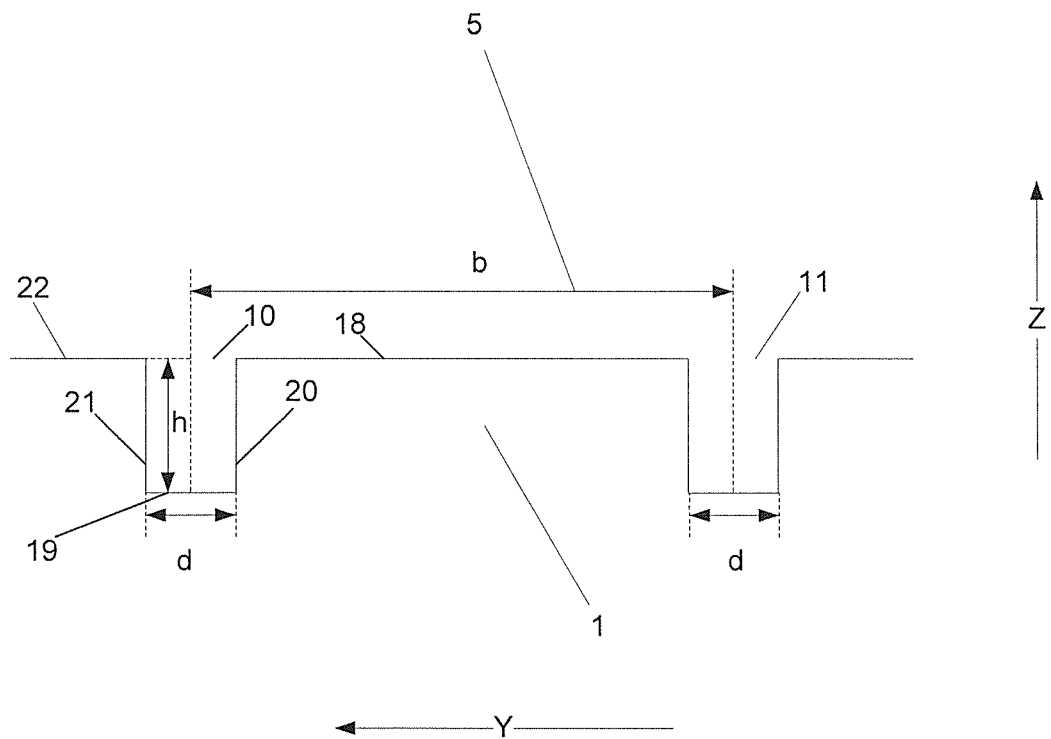
FIG. 1(C) is a simplified diagram showing a cross-section view of the reusable substrate along the Y axis according to an embodiment of the present invention.

FIG. 1(C) is a simplified diagram showing a cross-section view of the reusable substrate 1 along the Y axis according to an embodiment of the present invention. This diagram is merely an example, which should not unduly limit the scope of the claims. One of ordinary skill in the art would recognize many variations, alternatives, and modifications. For example, along a line 7 (e.g., along the Y axis), the cross-section view of two grooves 10 and 11 are shown in FIG. 1(C).

In one embodiment, the groove 10 has a bottom surface 19 (e.g., a planar bottom surface) and two side surfaces 20 and 21. For example, the side surfaces 20 and 21 are in contact, directly or indirectly, with regions 18 and 22 of the top surface of the substrate 1 respectively. In another example, the side surfaces 20 and 21 are in contact, directly or indirectly, with the bottom surface 19. In yet another example, the depth (e.g., h) of the groove 10 is approximately in a range of 1 nm-500 μm. In yet another example, the width (e.g., d) of the groove 10 (e.g., between the side surfaces 20 and 21) is approximately in a range of 0.1 μm-5 mm. In yet another example, the Z axis is perpendicular to the X axis and the Y axis. In yet another example, the bottom surface 19 is parallel to the top surface of the substrate 1. In yet another example, the bottom surface 19 is parallel to the top surface of the substrate 1. In yet another example, the side surfaces 20 and 21 are not continuous. In yet another example, the side surfaces 20 and 21 are in contact with the bottom surface 19 through one or more other surfaces. In yet another example, the groove 11 has a similar structure as the groove 10.

Referring to FIG. 1(A), FIG. 1(B) and FIG. 1(C), each bottom surface of a groove (e.g., grooves 8, 9, 10, 11, etc.) corresponds to a bottom surface area, and a total bottom surface area is equal to a sum of the bottom surface areas discounting the overlaps of the bottom surfaces. For example, the total bottom surface area is no larger than 10% of a sum of the total bottom surface area and the area of the top surface of the entire substrate 1.

Figure 2:
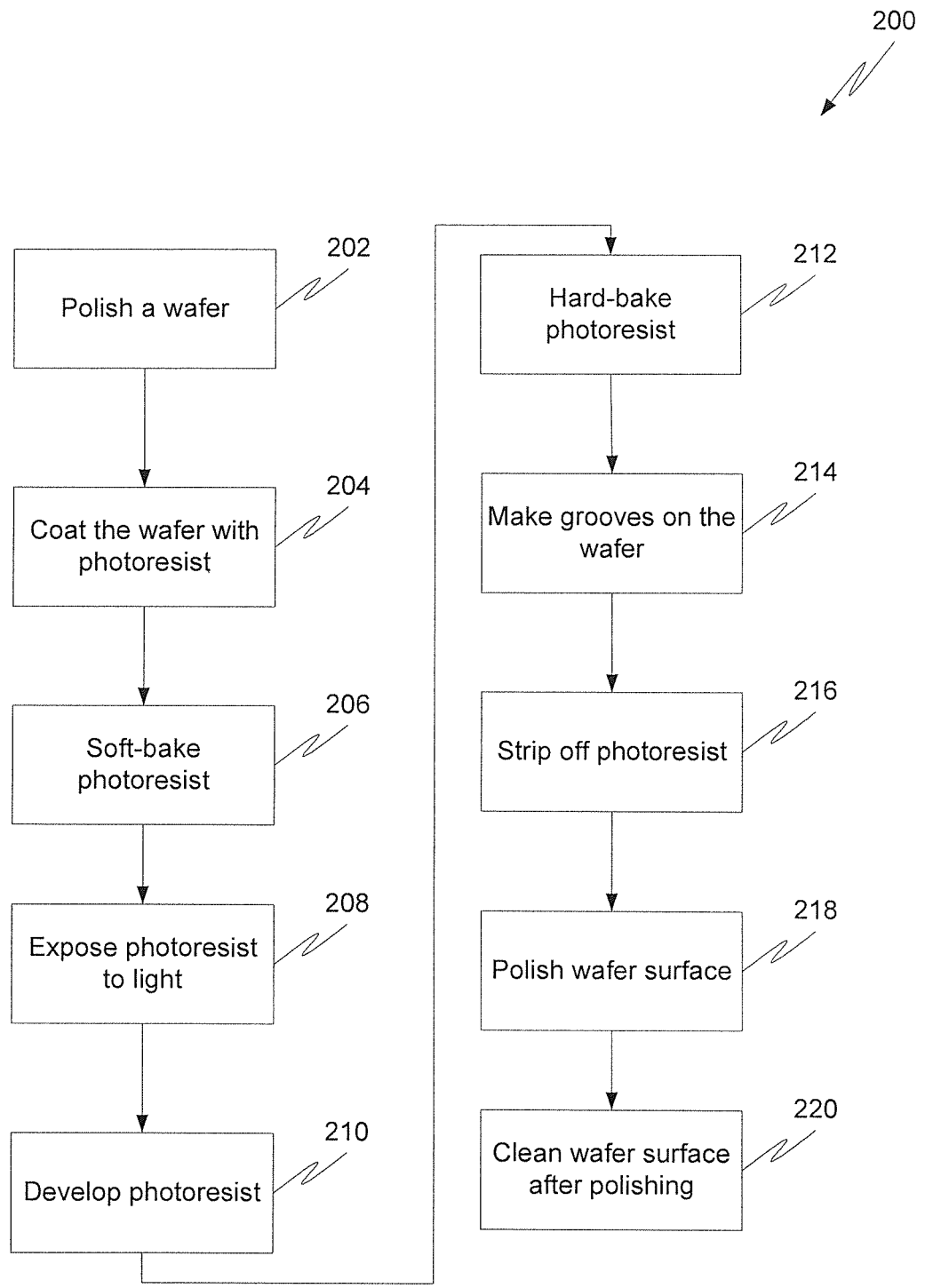
FIG. 2 is a simplified flow diagram showing a method for fabricating the reusable substrate as shown in FIGS. 1(A), 1(B), and 1(C) according to certain embodiments of the present invention.

FIG. 2 is a simplified flow diagram showing a method for fabricating the reusable substrate 1 as shown in FIGS. 1(A), 1(B), and 1(C) according to certain embodiments of the present invention. This diagram is merely an example, which should not unduly limit the scope of the claims. One of ordinary skill in the art would recognize many variations, alternatives, and modifications. The method 200 for fabricating the reusable substrate 1 includes a process 202 for polishing a wafer, a process 204 for coating a photoresist layer on the wafer, a process 206 for soft-baking the photoresist layer, a process 208 for exposing the photoresist layer to light, a process 210 for developing the photoresist layer, a process 212 for hard-baking the photoresist layer, a process 214 for making grooves on the wafer, a process 216 for stripping off the photoresist layer, a process 218 for polishing the wafer surface, and a process 220 for cleaning the wafer surface after polishing.

According to one embodiment, the wafer (e.g., a sapphire wafer) is polished at the process 202. For example, the wafer is grinded before being polished. In another example, the wafer is polished using a $SiO_2$ slurry (with a pH value approximately in the range of 9.5-11.5), with a polishing pressure approximately in a range of 2-15 psi. In yet another example, the wafer is polished at a rotating speed approximately in a range of 20-120 rpm. In yet another example, the wafer is polished (e.g., to planarize a top surface of the wafer) at a temperature approximately in a range of 10-60° C. In yet another example, the wafer is polished until the surface roughness is approximately in a range of 0.9-1 nm.

According to another embodiment, the polished wafer is coated with a photoresist layer at the process 204. For example, an automatic photoresist coating machine is used for coating the photoresist layer on the polished wafer (e.g., on the planarized top surface). In another example, the automatic photoresist coating machine spins for about 5-10 seconds with a speed approximately in a range of 300-500 rpm, and then spins for approximately 30-35 seconds with a speed approximately in a range of 2000-3000 rpm. In yet another example, the thickness of the coated photoresist layer is approximately in a range of 0.5-1.5 μm.

According to yet another embodiment, the wafer coated with the photoresist layer is soft-baked at the process 206. For example, the temperature for soft-baking is approximately in a range of 80-110° C., and the time period for soft-baking is approximately in a range of 30-120 seconds. In one embodiment, after soft-baking, the photoresist layer is exposed to light (or electrons, laser) at the process 208. For example, the light for exposure is approximately in a wavelength range of 350-480 nm. In another example, the light intensity is approximately in a range of 300-400 mw/cm$^2$, and the time period for exposure is approximately in a range of 150-600 milliseconds.

In another embodiment, after light exposure, the wafer coated with the photoresist layer is baked (e.g., on a hot plate and/or in an oven) in order to reduce a standing-wave effect in the photoresist layer resulting from light exposure. For example, the temperature for the post-exposure bake is approximately in a range of 110-120° C., and the time period for post-exposure bake is approximately in a range of 40-90 seconds. In yet another embodiment, the photoresist layer is developed at the process 210. For example, the time period for developing the photoresist layer is approximately in a range of 10-30 seconds. In another example, a pattern appears on the photoresist layer after development. In yet another example, a top view of the developed pattern on the photoresist layer is similar to the top view of the grooves on the substrate 1 as shown in FIG. 1(A).

According to another embodiment, the photoresist layer is hard-baked at the process 212. For example, the photo resist is hard-baked (e.g., on a hot plate and/or in an oven) at a temperature approximately in a range of 120-180° C. in order to harden the photoresist layer for subsequent processing. According to yet another embodiment, grooves are made on the wafer using the developed pattern of photoresist layer at the process 214. Different techniques, such as dry etching (e.g., inductively-coupled plasma etching), wet etching, laser processing, and mechanical processing, can be implemented to make grooves in certain embodiments. For example, the grooves are made using the inductively-coupled plasma etching with an etching time period approximately in a range of 1-50 minutes. In another example, the particular technique chosen to make the grooves and the processing time period affect the widths, the depths, the side surfaces, and the bottom surfaces of the grooves 2 as shown in FIG. 1(B) and FIG. 1(C).

In one embodiment, the photoresist layer is stripped off at the process 216. For example, There are two photoresist stripping techniques: wet stripping (e.g., using one or more organic solutions and/or one or more inorganic solutions) and dry stripping (e.g., using plasma). In another example, a wet-stripping process includes the following steps: cleaning the wafer with N-Methylpyrrolidone (NMP) for about 5-6 minutes at a temperature approximately in a range of 105-110° C.; cleaning the wafer with NMP for about 5-6 minutes at a temperature approximately in a range of 20-25° C.; cleaning the wafer with acetone for about 2.5-3 minutes at a temperature approximately in a range of 20-25° C.; cleaning the wafer using Isopropyl alcohol (IPA) for about 2.5-3 minutes at a temperature approximately in a range of 20-25° C.; and cleaning the wafer using deionized water for about 2.5-3 minutes at a temperature approximately in a range of 20-25° C.

In another embodiment, the wafer is polished (e.g., with a CMP) at the process 218. For example, a SiO$_2$ slurry is used for polishing the wafer, and has a pH value approximately in a range of 9.5-11.5. In another example, a pressure for polishing is approximately in a range of 2-15 psi. In yet another example, the wafer is polished at a rotating speed approximately in a range of 20-120 rpm. In yet another example, the wafer is polished at a temperature approximately in a range of 10-60° C. In yet another example, the wafer is polished until the surface roughness is approximately less than 0.3 nm.

The polished wafer is then cleaned at the process 220 in some embodiments. For example, a solution including mixed acids (e.g., 3-4 parts of sulfuric acid in volume and 1-2 parts of phosphoric acid in volume) is used for cleaning the polished wafer. In another example, the polished wafer is cleaned in the solution for about 10-12 minutes at a temperature approximately in a range of 110-150° C. In yet another example, the wafer is spin-dried after cleaning.

As discussed above and further emphasized here, FIG. 2 is merely an example, which should not unduly limit the scope of the claims. One of ordinary skill in the art would recognize many variations, alternatives, and modifications. For example, certain processes of the method for fabricating the reusable substrate 1 as shown in FIG. 2 can be omitted or combined in certain embodiments. In another example, other processes can be added to the method for fabricating the reusable substrate 1. As an example, the post-exposure bake process described above is omitted in some embodiments.

Figure 3:
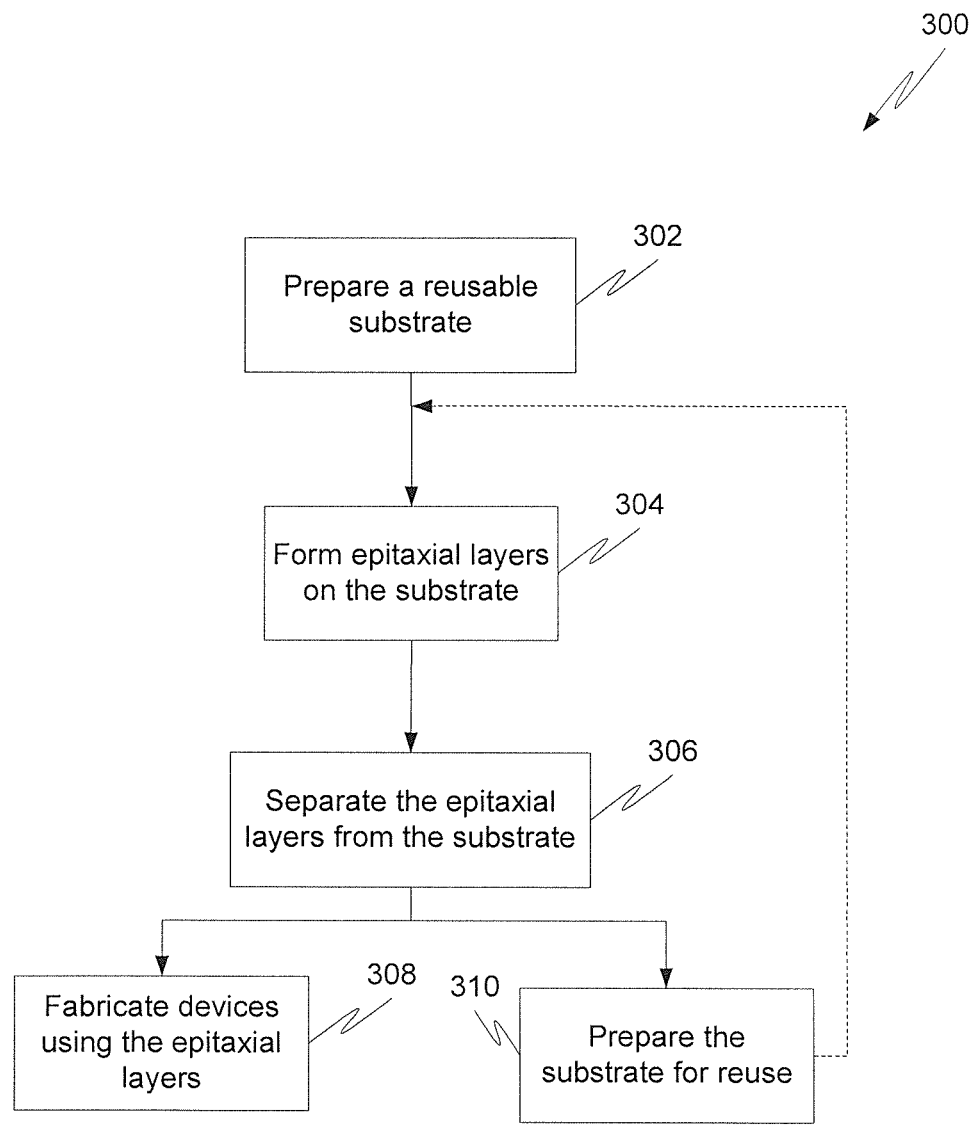
FIG. 3 is a simplified flow diagram showing a method for reusing the substrate as shown in FIGS. 1(A), 1(B), and 1(C) for device fabrication according to some embodiments of the present invention.

FIG. 3 is a simplified flow diagram showing a method for reusing the substrate 1 as shown in FIGS. 1(A), 1(B), and 1(C) for device fabrication according to some embodiments of the present invention. This diagram is merely an example, which should not unduly limit the scope of the claims. One of ordinary skill in the art would recognize many variations, alternatives, and modifications. The method 300 for reusing the substrate 1 includes a process 302 for preparing the reusable substrate 1, a process 304 for forming one or more epitaxial layers (e.g., GaN) on the substrate 1, a process 306 for separating the epitaxial layers from the substrate 1, a process 308 for fabricating one or more devices (e.g., one or more LEDs) using the separated epitaxial layers, and a process 310 for preparing the substrate 1 for reuse.

According to one embodiment, the reusable substrate 1 is prepared at the process 302. For example, the reusable substrate 1 is fabricated according to the method 200 as shown in FIG. 2, and the reusable substrate 1 includes grooves (e.g., a matrix) as shown in FIG. 1(A). According to another embodiment, epitaxial layers are formed on the reusable substrate 1 at the process 304. For example, the epitaxial layers are formed on the plurality of planar regions (e.g., regions 12 and 18) on the top surface of the substrate 1. In another example, various materials (e.g., GaN and/or AlN) that have different lattice constants than the substrate 1 (e.g., sapphire) can be formed on the substrate 1. In yet another example, different methods (e.g., MOCVD, liquid-phase epitaxy, vapor-phase epitaxy, molecular beam epitaxy) can be used to form epitaxial layers on the substrate 1. In yet another example, the epitaxial layers are deposited and/or grown on the substrate 1 from one or more gaseous precursors and/or one or more liquid precursors. In yet another example, the epitaxial layers have one or more crystallographic orientations with respect to the substrate 1. In yet another example, a resulting epitaxial structure including the substrate 1 and the epitaxial layers is wax-mounted on a wafer carrier (e.g., for lift-off).

The epitaxial layers (e.g., GaN and/or AlN) formed on the substrate 1 are separated from the substrate 1 at the process 306, in some embodiments. For example, a laser lift-off process is implemented (e.g., using ultra-violet laser) to separate the epitaxial layers from the substrate 1 (e.g., from the plurality of planar regions on the top surface of the substrate 1). In another example, the epitaxial layers after such separation, there is little substrate left on the epitaxial layers, and thus back-side thinning is not needed for device fabrication. At the process 308, one or more devices (e.g., LEDs) can be fabricated using the separated epitaxial layers according to certain embodiments. For example, the separated epitaxial layers become, with or without further processing, at least a part of the fabricated devices. In another example, one or more heat-conducting materials, such as silicon and/or aluminum nitride, are deposited on the backside of the devices as heat sinks to improve heat dissipation of the devices. In yet another example, one or more reflective metals, such as aluminum and/or silver, are deposited on a backside of the devices to boost the brightness of the LED devices. In yet another example, both the heat-conducting materials and the reflective metals are deposited on the back side of the devices. According to another embodiment, the reusable substrate 1, after being separated from the epitaxial layers, is prepared for reuse at the process 310. For example, the surface of the substrate 1 is grinded, polished and cleaned. In another example, after the process 310, the substrate 1 is reused at process 304 for forming one or more epitaxial layers. In yet another example, the substrate 1 is reused at process 304 for forming epitaxial layers of same or different materials during different fabrication cycles.

Figure 4:
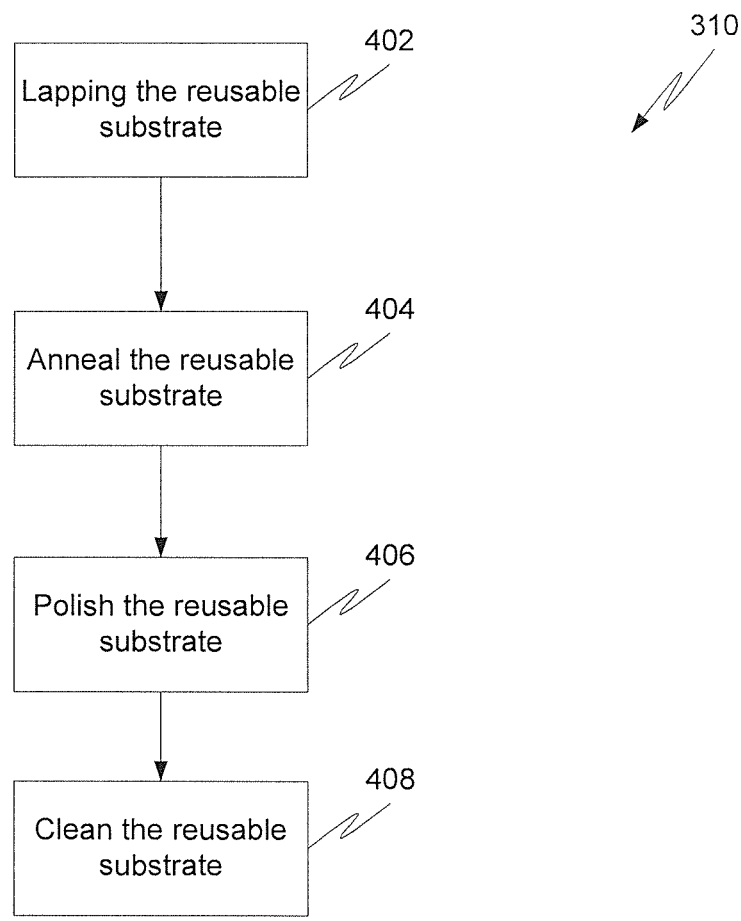
FIG. 4 is a simplified flow diagram showing the process for preparing the reusable substrate after being separated from epitaxial layers for reuse according to one embodiment of the present invention.

FIG. 4 is a simplified flow diagram showing the process 310 for preparing the reusable substrate 1 after being separated from epitaxial layers for reuse according to one embodiment of the present invention. This diagram is merely an example, which should not unduly limit the scope of the claims. One of ordinary skill in the art would recognize many variations, alternatives, and modifications. The process 310 includes a process 402 for lapping the reusable substrate 1, a process 404 for annealing the reusable substrate 1, a process 406 for polishing the reusable substrate 1 (e.g., with CMP), and a process 408 for cleaning the reusable substrate 1 (e.g., with a mixture of acids).

According to one embodiment, the reusable substrate 1 is lapped at the process 402. For example, a polycrystalline diamond slurry is used for lapping the reusable substrate 1 to improve the surface roughness and reduce the surface damage. According to another embodiment, the substrate 1 is then polished (e.g., with a CMP) at the process 406. For example, a colloidal silica is used as a polishing slurry to polish the substrate 1. In another example, a pressure for polishing is approximately in the range of 2-15 psi. In yet another example, the substrate 1 is polished at a rotating speed approximately in a range of 20-120 rpm. In yet another example, the substrate 1 is polished at a temperature approximately in a range of 10-60° C. In yet another example, the polishing slurry is adjusted using a NaOH solution to a pH value approximately in a range of 9.5-11.5. The polished substrate 1 is then cleaned at the process 408 in some embodiments. For example, a solution including mixed acids (e.g., sulfuric acid and phosphoric acid) is used for cleaning the polished substrate 1. In another example, the substrate 1 is inspected to ensure that the surface of the substrate 1 is ready for forming epitaxial layers. Once the surface of the substrate 1 is ready, the substrate 1 is reused to form epitaxial layers of various materials as shown in FIG. 3 according to certain embodiments.

According to another embodiment, a reusable substrate with at least a plurality of grooves for electronic device fabrication includes a substrate body made of one or more substrate materials and including a top planar surface, the top planar surface being divided into a plurality of planer regions by the plurality of grooves, the plurality of grooves including a plurality of bottom planar surfaces. Each of the plurality of grooves includes a bottom planar surface and two side surfaces, the bottom planar surface being selected from the plurality of bottom planar surfaces, the two side surfaces being in contact with the top surface and the bottom surface. The bottom planar surface is associated with a groove width from one of the two side surfaces to the other of the two side surfaces, the groove width ranging from 0.1 µm to 5 mm. The two side surfaces are associated with a groove depth from the top planar surface to the bottom planar surface, the groove depth ranging from 1 nm to 500 µm. Each of the plurality of regions is surrounded by a first groove, a second groove, a third groove and a fourth groove, all of the first groove, the second groove, the third groove and the fourth groove being selected from the plurality of grooves. The first groove and the second groove are parallel to each other and separated by a first groove interval ranging from 0.1 mm to 50 mm. The third groove and the fourth groove are parallel to each other and separated by a second groove interval ranging from 0.1 mm to 50 mm. The first groove and the third groove are perpendicular to each other. The top planar surface is parallel to each of the plurality of bottom surfaces, the top planar surface being associated with a first surface area, the plurality of bottom surfaces together being associated with a second surface area. The second surface area is equal to or less than 10% of a sum of the first surface area and the second surface area. For example, the substrate is implemented according to at least FIG. 1(A), FIG. 1(B) and/or FIG. 1(C).

According to another embodiment, a reusable substrate with at least a plurality of grooves for electronic device fabrication includes a substrate body made of sapphire and including a top planar surface, the top planar surface being divided into a plurality of planer regions by the plurality of grooves, the plurality of grooves including a plurality of bottom planar surfaces. Each of the plurality of grooves includes a bottom planar surface and two side surfaces, the bottom planar surface being selected from the plurality of bottom planar surfaces, the two side surfaces being in contact with the top surface and the bottom surface. The bottom planar surface is associated with a groove width from one of the two side surfaces to the other of the two side surfaces, the groove width ranging from 0.1 µm to 5 mm. The two side surfaces are associated with a groove depth from the top planar surface to the bottom planar surface, the groove depth ranging from 1 nm to 500 µm. Each of the plurality of regions is surrounded by a first groove, a second groove, a third groove and a fourth groove, all of the first groove, the second groove, the third groove and the fourth groove being selected from the plurality of grooves. The first groove and the second groove are parallel to each other and separated by a first groove interval ranging from 0.1 mm to 50 mm. The third groove and the fourth groove are parallel to each other and separated by a second groove interval ranging from 0.1 mm to 50 mm. The first groove and the third groove are perpendicular to each other. The top planar surface is parallel to each of the plurality of bottom surfaces, the top planar surface being associated with a first surface area, the plurality of bottom surfaces together being associated with a second surface area. The second surface area is equal to or less than 10% of a sum of the first surface area and the second surface area. For example, the substrate is implemented according to at least FIG. 1(A), FIG. 1(B) and/or FIG. 1(C).

According to yet another embodiment, a method for making a reusable substrate with at least a plurality of grooves for electronic device fabrication includes providing a substrate body made of one or more substrate materials and including a top surface, polishing the substrate body to planarize the top surface, and coating the substrate body by forming a photoresist layer on the planarized top surface. The method further includes patterning the photoresist layer, using the patterned photoresist layer to form the plurality of grooves in the substrate body, and dividing the top planar surface by the plurality of grooves into a plurality of planar regions, the plurality of planar regions including a plurality of planar bottom surfaces parallel to the top planar surface, each of the plurality of grooves being associated with a groove width ranging from 0.1 to 5 mm and a groove depth ranging from 1 nm to 500 µm, each of the planar regions being associated with a dimension ranging from 0.1 mm to 50 mm. The top planar surface is associated with a first surface area. The plurality of bottom surfaces together is associated with a second surface area. The second surface area is equal to or less than 10% of a sum of the first surface area and the second surface area. For example, the method is implemented according to at least FIG. 1(A), FIG. 1(B), FIG. 1(C) and/or FIG. 2.

According to yet another embodiment, a method for using a reusable substrate made of at least a first material with at least a plurality of grooves for electronic device fabrication includes preparing the reusable substrate including a top planar surface, the top planar surface being divided by the plurality of grooves into a plurality of planar regions, the plurality of planar regions including a plurality of planar bottom surfaces parallel to the top planar surface, each of the plurality of grooves being associated with a groove width ranging from 0.1 µm to 5 mm and a groove depth ranging from 1 nm to 500 µm, each of the planar regions being associated with a dimension ranging from 0.1 mm to 50 mm. The method further includes forming at least a first epitaxial layer made of at least a second material on the plurality of planar regions, separating at least the first epitaxial layer from each of the plurality of planar regions, and after at least the first epitaxial layer is separated from each of the plurality of planar regions, forming at least a second epitaxial layer made of at least a third material on the plurality of planar regions. The plurality of planar regions together is associated with a first surface area. The plurality of bottom surfaces together is associated with a second surface area. The second surface area is equal to or less than 10% of a sum of the first surface area and the second surface area. For example, the method is implemented according to at least FIG. 1(A), FIG. 1(B), FIG. 1(C), FIG. 3 and/or FIG. 4.

Although specific embodiments of the present invention have been described, it will be understood by those of skill in the art that there are other embodiments that are equivalent to the described embodiments. For example, the reusable substrate 1 as disclosed above is made of a mono-crystalline material (e.g., a single crystal material), in which the crystal lattice of the substrate is continuous and unbroken (e.g., with no grain boundaries). In another example, the reusable substrate 1 as disclosed above is made of a mono-crystalline material which contains small quantities of other chemical elements that can change, in a controlled manner, the semiconducting properties of the substrate. In yet another example, the reusable substrate 1 as disclosed above is made of a poly-crystalline material in which the crystal lattice of at least a top portion below the top surface is continuous. In yet another example, various embodiments and/or examples of the present invention can be combined. Accordingly, it is to be understood that the invention is not to be limited by the specific illustrated embodiments, but only by the scope of the appended claims.

What is claimed is:

1. A method for using a reusable substrate made of a first material with a plurality of grooves for electronic device fabrication, said method comprising:

preparing a reusable substrate including a top planar surface, the top planar surface being divided by a plurality of grooves into a plurality of planar regions, the plurality of planar regions including a plurality of planar bottom surfaces parallel to the top planar surface;

forming a first epitaxial layer made of a second material on the plurality of planar regions, the first epitaxial layer being in direct contact with the top planar surface;

separating the first epitaxial layer from each of the plurality of planar regions, the first epitaxial layer being separated directly from the top planar surface; and after the first epitaxial layer is separated from each of the plurality of planar regions, forming a second epitaxial layer made of a third material on the plurality of planar regions, the second epitaxial layer being in direct contact with the top planar surface.

2. The method of claim 1, and further comprising:
lapping the reusable substrate after the first epitaxial layer is separated from the reusable substrate;
annealing the reusable substrate;
polishing the reusable substrate; and
cleaning the reusable substrate.

3. The method of claim 1, and further comprising:
separating the second epitaxial layer from each of the plurality of planar regions; and
after the second epitaxial layer is separated from the plurality of planar regions, forming a third epitaxial layer on the plurality of planar regions, the third epitaxial layer being in direct contact with the top planar surface.

4. The method of claim 1 wherein the process for separating the first epitaxial layer from each of the plurality of planar regions is performed using a laser lift-off technique.

5. The method of claim 1 wherein after the first epitaxial layer is separated from each of the plurality of planar regions, using the separated first epitaxial layer to fabricate one or more light emitting diodes.

6. The method of claim 1 wherein the first material has a lattice constant different from the second material.

7. The method of claim 1 wherein the first material has a lattice constant different from the third material.

8. The method of claim 1 wherein the second material and the third material are the same.

9. The method of claim 1 wherein the second material and the third material are different.

10. The method of claim 1 wherein the reusable substrate is made of at least one selected from a group consisting of mono-crystalline sapphire, mono-crystalline SiC, mono-crystalline GaN, mono-crystalline GaAs, mono-crystalline Si, mono-crystalline AlN, mono-crystalline ZnO, and mono-crystalline MgO.

11. The method of claim 1 wherein the second material includes one selected from a group consisting of gallium nitride and aluminum nitride.

12. The method of claim 1 wherein the third material includes one selected from a group consisting of gallium nitride and aluminum nitride.

13. The method of claim 1 wherein after the first epitaxial layer is separated from each of the plurality of planar regions, the separated first epitaxial layer is used, without further processing, for fabricating one or more electronic devices.

14. The method of claim 1 wherein after the first epitaxial layer is separated from each of the plurality of planar regions, the separated first epitaxial layer is further processed before being used for fabricating one or more electronic devices.

* * * * *